United States Patent [19]

Johnson et al.

[11] Patent Number: 4,728,869

[45] Date of Patent: Mar. 1, 1988

[54] PULSEWIDTH MODULATED PRESSURE CONTROL SYSTEM FOR CHEMICAL VAPOR DEPOSITION APPARATUS

[75] Inventors: Noel H. Johnson, San Jose; Gary C. Elliott, Manteca, both of Calif.

[73] Assignee: Anicon, inc., San Jose, Calif.

[21] Appl. No.: 845,212

[22] Filed: Mar. 27, 1986

Related U.S. Application Data

[63] Continuation-in-part of Ser. No. 813,915, Dec. 18, 1985, abandoned.

[51] Int. Cl.[4] ............................................. H02P 5/16
[52] U.S. Cl. ..................................... 318/335; 318/341; 318/481; 318/599; 318/645
[58] Field of Search ................ 318/599, 341, 481, 335, 318/645, 331

[56] References Cited

U.S. PATENT DOCUMENTS

| | | | |
|---|---|---|---|
| 3,445,739 | 5/1969 | Martz | 318/341 X |
| 3,686,557 | 8/1972 | Futamora | 318/599 |
| 3,874,407 | 4/1975 | Griswold | 137/596.17 |
| 3,962,620 | 6/1976 | Dion | 318/599 |
| 3,979,654 | 9/1976 | Guicheteau | 318/341 UX |
| 4,081,734 | 3/1978 | Mac Spadden et al. | 318/645 |
| 4,146,828 | 3/1979 | Ross | 318/599 |
| 4,204,143 | 5/1980 | Coleman | 318/341 |
| 4,236,106 | 11/1980 | Davis | 318/599 |
| 4,473,783 | 9/1984 | Morez | 318/331 |

FOREIGN PATENT DOCUMENTS 1400843 7/1975 United Kingdom ................ 318/645

OTHER PUBLICATIONS

IBM Tech. Disclosure Bulletin, vol. 18, No. 7, Dec. 75, p. 2082 "Controlling (Reaction) Pressure in CUD Tools", by R. F. Chapello.

Primary Examiner—Benjamin Dobeck
Attorney, Agent, or Firm—William B. Walker

[57] ABSTRACT

A low pressure control system for chemical vapor deposition (CVD) apparatus, including a vacuum pressure chamber and an exhaust pump, is provided by a vacuum pump DC motor which is supplied power from a DC motor speed controller coupled to a DC control input signal from a pulsewidth modulation DC converter. The converter receives a single pulsewidth modulated pulse train having its percentage of modulation controlled in accordance with a DC to pulsewidth modulation controller which operates in accordance with the difference between a pair of DC input signals corresponding to the actual pressure inside the vacuum pressure chamber and a desired or set point pressure respectively. The vacuum pump motor speed and accordingly the exhaust pump is controlled with a high degree of precision, thereby providing improved coating uniformity of semiconductor wafers being fabricated by the CVD apparatus.

20 Claims, 3 Drawing Figures

PULSEWIDTH MODULATED PRESSURE CONTROL SYSTEM FOR CHEMICAL VAPOR DEPOSITION APPARATUS

CROSS REFERENCE TO RELATED APPLICATION

This is a continuation-in-part application of a prior copending application, Ser. No. 813,915 entitled, "Pressure Control System For Chemical Vapor Deposition Apparatus", filed on Dec. 18, 1985 now abandoned.

BACKGROUND OF THE INVENTION

1. Field of the Invention

This invention relates generally to pressure control systems and more particularly to vacuum pressure control systems for chemical vapor deposition apparatus.

2. Description of the Prior Art

Chemical vapor deposition (CVD) is a process for depositing a solid material from a gaseous phase onto a substrate by means of a chemical reaction. The deposition reaction involved is generally thermal decomposition, chemical oxidation, or chemical reduction. In thermal decomposition, for example, organometallic compounds are transported to the surface of the substrate as a vapor and are reduced thereat to the elemental metal state on the substrate surface. Although such deposition on substrates can be utilized for a variety of purposes, CVD apparatus is particularly useful in manufacturing solid state electronic devices and energy conversion devices.

For reference, chemical vapor deposition of electronic materials is described, for example, in the following publications: T. L. Chu, et al., *J. Bac. Sci. Technol.*, 10, 1 (1973), and B. E. Watts, *Thin Solid Films*, 18, 1 (1973). These publications describe the formation and doping of epitaxial films comprised of such materials as silicon, germanium and gallium arsenide. In the field of energy conversion, the CVD process provides materials for nuclear fission product retention, solar energy collection and super conduction. A summary of the chemical vapor deposition field is furthermore provided by W. A. Briant, in "The Fundamentals of Chemical Vapor Deposition", *Journal of Materials Science*, 12, 1285, (1977).

The deposition parameters of temperature, pressure, the ratio of reactant gases and amount of distribution of gas flow critically determine the deposition rates and the ability of a particular system to provide the desired uniformity and quality of deposition. The limitations of prior art systems stem from their inability to adequately control one or more of these factors or from deposit's contamination.

One known specific type of improved CVD apparatus comprises an invention entitled, "Chemical Vapor Deposition Apparatus", U.S. Ser. No. 528,193, Bryant A Campbell, et al., filed on Aug. 31 1983, and which is assigned to the assignee of the present invention. In that apparatus, an inner deposition chamber having gas distribution means for introducing gas into the inner chamber and removing gas therefrom and a vacuum chamber means surrounding the inner deposition reaction chamber and spaced from the walls thereof for maintaining a minimum vacuum therein is described. The vacuum chamber means further comprises a domed housing and a base cooperating therewith and wherein the material of the domed housing and the base are substantially transparent to radiation. Radiant heating means are positioned over the outer surface of the domed housing and the base surrounding the inner deposition chamber for providing precisely controlled temperatures in the reaction chamber. The radiant heating means and the outer surface of the domed housing and base are in a non-conducting relationship. The radiant heating means preferably have the same temperature achieved by having the same cross sectional areas and currents. The domed housing has a base which engages a support plate with seals being positioned between the base and the support plate to form a vacuum seal. Cooling means engage the outer wall of the domed housing between the base and the portion thereof surrounding the deposition chamber for removing heat therefrom to protect the seals. The quartz vacuum chamber base furthermore has an outer domed portion and an axially concentric inner cylindrical portion integral therewith. Such a structure provides a chemical vapor deposition system which provides a more uniform temperature in the inner deposition reaction chamber.

With respect to conventional CVD apparatus as well as the system referred to above, various servo types of control systems have been suggested for controlling the extremely low pressures (0-10 torr) which are required in such apparatus. Typically, the internal pressure is monitored by a transducer which operates to generate an electrical analog signal indicative of the internal pressure. This signal is compared with another electrical signal indicative of a desired pressure or set point using a proportional integral derivative type of controller. An analog error signal is then generated which is utilized to control the power applied to an electrical motor coupled to a vacuum pump whereupon the vacuum pump's speed and vacuum pressure are changed until there is substantially zero error between the actual pressure and the desired or set point pressure.

With this type of pressure control system, a serious limitation exists due to the fact that the analog signal is sensitive to environmental noise and particularly if the vacuum pump connected to the vacuum chamber is remote from the CVD apparatus. At sensitive levels of operation, it has been found impossible to prevent the fluctuations, even though shielding of interconnecting electric cables have been utilized. This factor presents a limit to the levels of coating uniformity which can be realized and accordingly the resulting yield.

Other known means for controlling pressure in these types of vapor deposition systems are disclosed in: *IBM Technical Disclosure Bulletin*, 1975, at page 2082 entitled, "Controlling (Reaction) Pressure In CVD Tools", by R. E. Chappelo, et al., and Japanese Pat. No. 56-152,738, dated Nov. 26, 1981, and being assigned to Mitshbishi Electric Company. In the former publication, a pressure transducer provides an output signal to a differential amplifier which compares the measured signal against a signal representing the desired pressure. The output of the differential amplifier is used to control an element which is used to modulate the position of an electrically controlled valve. In the latter patent, a branch pipe is connected in parallel to the reactor tube between the gas feeder and the evacuator and a sensor is inserted into the branch tube to measure the pressure in the tube. Depending upon the measured pressure, i.e. the vacuum in the tube, a rotary pump of the evacuator is controlled to obtain the desired pressure in the tube.

Additionally, it should also be pointed out that pulsewidth modulation servo control systems are generally known. Typical examples include: U.S. Pat. No. 3,686,557, entitled, "Floating Pipe Electronic Servo Motor Process Controller", issued to John Futamora, on Aug. 22, 1972; U.S. Pat. No. 3,874,407, entitled, "Pulse Width Modulation Control For Valve", which issued to R. F. Griswold on Apr. 1, 1975; U.S. Pat. No. 4,146,828, entitled, "Pulse Modulated Servo Amplifier", which issued to R. E. Ross, et al. on Mar. 27, 1979; U.S. Pat. No. 4,204,143, entitled, "Pulse Width Modulated Power Amplifier For Direct Current Motor Control", which issued to R. D. Coleman on May 20, 1980; and U.S. Pat. No. 4,236,106, entitled, "Automatic Pulse Controlled Servo Control System", which issued to D. M. Davis, et al. on Nov. 25, 1980.

Other servo type control systems of which applicants are also aware include: U.S. Pat. No. 3,445,739, entitled, "Variable Speed Control For Position Regulator Motor", which issued to L. F. Martz on May 20, 1969; U.S. Pat. No. 3,962,620, entitled, "Switching Apparatus", which issued to W. E. Dion on June 8, 1976; U.S. Pat. No. 3,979,654, entitled, "Process Control System Using A Two Wire Remote Control System", which issued to E. H. Guicheteau, et al. on Sept. 7, 1976; and U.S. Pat. No. 4,473,783, entitled, "Power Control Circuit", which issued to G. S. Morez on Sept. 25, 1984.

In the parent copending application entitled, "Pressure Control System For Chemical Vapor Deposition Apparatus", Ser. No. 813,915, referenced above, there is disclosed a pulsewidth modulated control of a 30 silicon controlled rectifier bridge type AC to DC converter which supplies power to a DC motor controlling the vacuum pump which operates to remove gases continuously fed into chemical vapor deposition apparatus during its operation. The actual pressure within the vapor deposition apparatus is sensed by a manometer type transducer which generates an electrical signal corresponding to pressure. This actual pressure signal is fed to an error signal amplifier along with an electrical signal corresponding to the desired pressure set point. An absolute voltage is provided at the output of the error signal amplifier which increases or decreases from the desired set point value depending upon the actual pressure measured. This signal is then commonly coupled to three phase comparators ($0_1$, $0_2$ and $0_3$) which additionally receive respective ramp signal generated from the 30 AC power signal fed to the converter. The respective outputs of the three comparators comprise three phases of pulsewidth modulated pulses which are fed as control signals to the SCR bridge converter for controlling the speed of the DC motor coupled to the vacuum pump.

SUMMARY

Accordingly, it is an object of the present invention to provide an improvement in chemical vapor deposition apparatus.

It is a further object of the invention to provide an improved system for controlling the relatively low pressure required for proper operation of the chemical vapor deposition apparatus.

Still a further object of the invention is to provide for precise control of the reduced atmosphere pressure in the vacuum pressure chamber of a chemical vapor deposition apparatus.

Briefly, the foregoing and other objects of the invention are achieved by a pulsewidth modulated (PWM) control system which generates a single pulsewidth modulated control signal. This signal is thereafter converted to a DC control signal and applied to a DC motor speed controller coupled to a DC motor which drives a vacuum pump connected to a chemical vapor deposition vacuum pressure chamber. The actual pressure within the chamber is sensed by a transducer which generates an electrical pressure signal which is coupled to control means comprising a DC to pulsewidth modulation controller along with an electrical set point signal indicative of the desired pressure. The controller additionally includes signal limiters, isolation amplifiers and a differential amplifier, the output of which is integrated to provide a DC signal of varying amplitude. This DC signal is fed to a pulsewidth modulator integrated circuit module which outputs a single stream of pulsewidth modulated signals. These signals are in turn fed to a pulsewidth modulation to DC converter circuit including an optoisolator circuit and a PWM to DC filter. The output of the filter comprises a DC control signal whose amplitude is selectively adjusted and fed as an input to a DC motor controller which controls the speed of the vacuum pump motor in accordance with the amplitude of the DC input signal fed thereto.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DETAILED DESCRIPTION OF THE INVENTION

Figure 1:
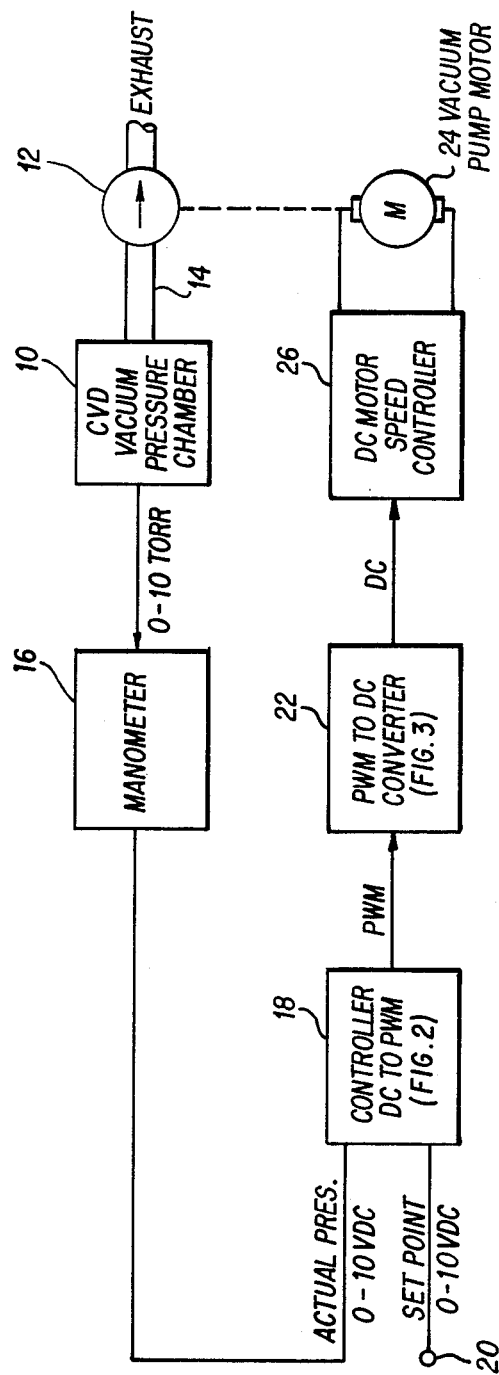
FIG. 1 is a system block diagram generally illustrative of the subject invention.

Referring now to the drawings and more particularly to FIG. 1, reference numeral 10 denotes the vacuum pressure chamber of a chemical vapor deposition (CVD) apparatus. Such apparatus comprises the CVD apparatus disclosed in U.S. Ser. No. 528,193, entitled, "Chemical Vapor Deposition Apparatus", referenced above, and which is specifically incorporated herein by reference. Such apparatus as has been noted realizes increased precision in coating semiconductor wafers with the attendent control problem of the reduced atmospheric pressure in the reaction chamber where gases are continuously fed into the system and removed with a vacuum pump.

Figure 2:
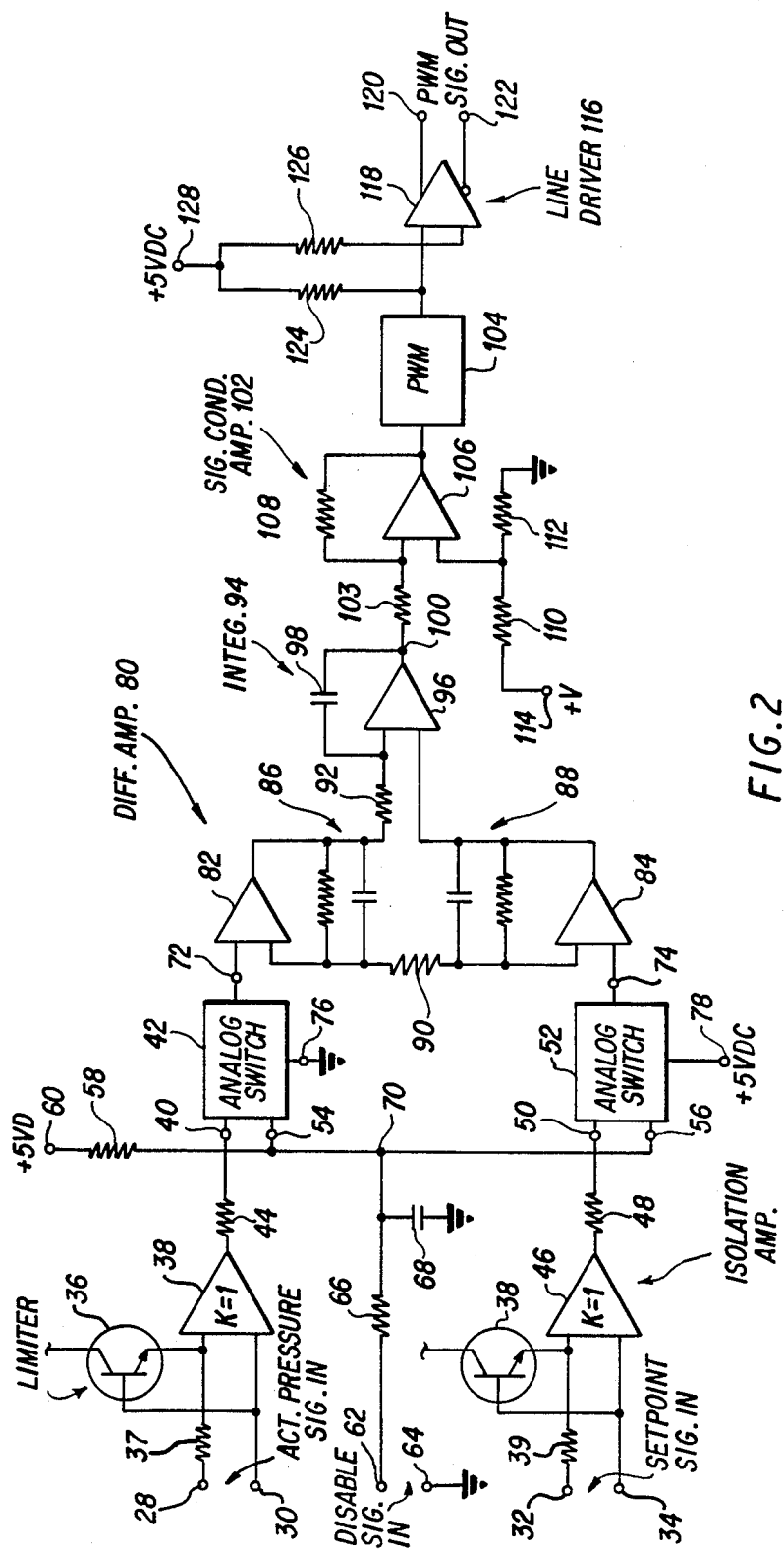
FIG. 2 is a simplified electrical schematic diagram illustrative of the DC to pulsewidth modulation controller shown in FIG. 1.

As further shown in FIG. 1, an exhaust conduit 14 links the vacuum pressure chamber 10 with a motor driven vacuum pump 12. The internal pressure within the vacuum chamber 10 ranges between 0 and 10 torr and is sensed by a transducer 16. The transducer typically comprises a manometer which is operable to generate an electrical output signal which ranges between 0 and 10 volts DC in response to the actual pressure present in the vacuum chamber 10. The DC output from the manometer 16 is fed to a DC to pulsewidth modulation controller 18, the details of which are shown in FIG. 2. A desired pressure or set point signal ranging between 0 and 10 volts DC and applied to terminal 20 from a source, not shown, is also coupled to the controller 18. This signal source may be comprised of a manually operated rheostat, potentiometer or DC voltage divider coupled across a regulated DC source.

Figure 3:
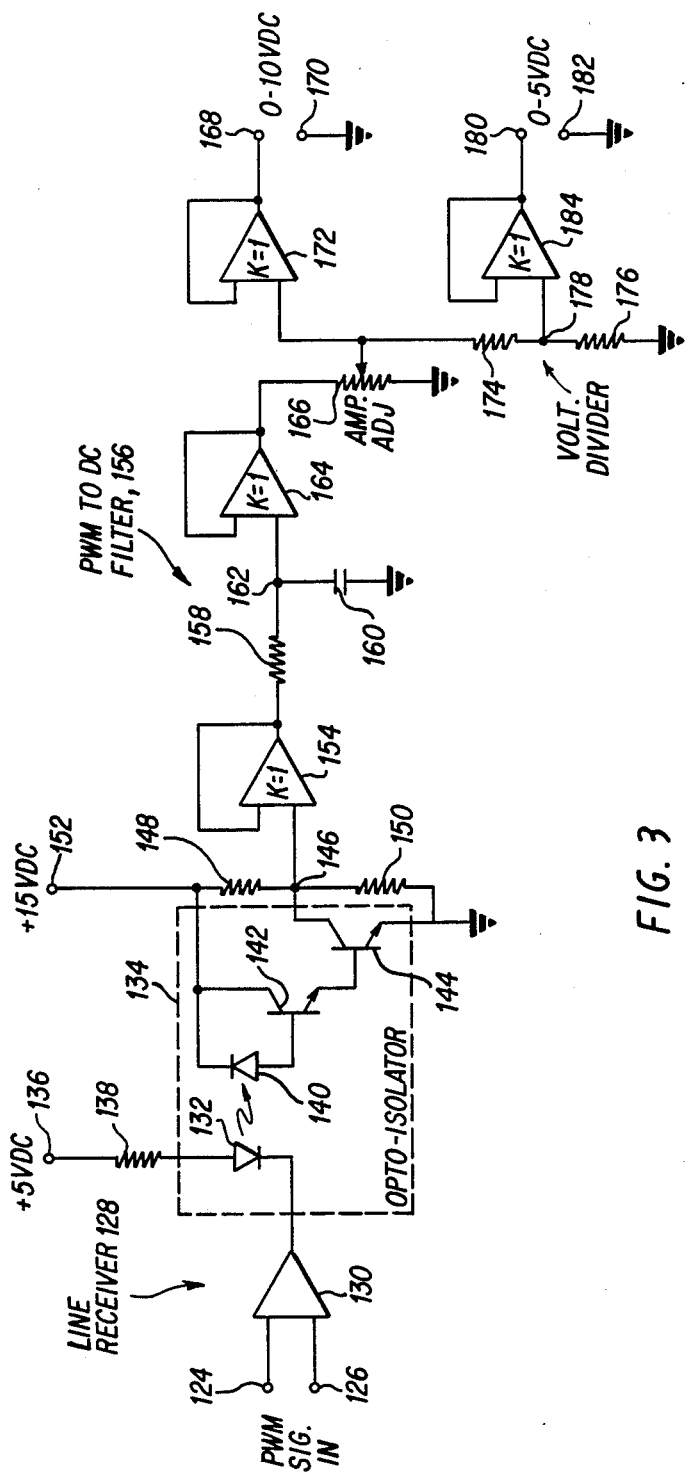
FIG. 3 is a simplified electrical schematic diagram illustrative of the pulsewidth modulation to DC converter shown in FIG. 1.

The controller 18 operates in response to the two pressure input signals to generate a single pulsewidth modulated signal output which is coupled to a pulsewidth modulation to DC converter 22, the details of which are shown in FIG. 3. The converter 22 operates to generate a variable DC control signal for controlling the speed of a DC motor 24 via a DC motor speed controller 26, which operates to vary the DC armature voltage and accordingly the speed of the motor 24. The motor speed in turn controls the vacuum pump 12 in a typical closed loop servo type control system.

With such an arrangement, ±0.1% variations at vacuum pressure in the region of 0–10 torr is obtainable as opposed to known prior art systems which are only able to provide ±0.3% variations in vacuum pressure when flow rates and set points are changed during a process run.

Referring now to FIG. 2, there is disclosed the details of the DC to pulsewidth modulation controller 18. As shown in FIG. 2, the actual DC pressure signal from the manometer 16 is applied across a pair of input terminals 28 and 30, with terminal 30, for example, acting as a signal return path. In a like manner, the DC set point pressure signal is applied across a pair of input terminals 32 and 34. The two DC signals are respectively limited by a pair of like transistors 36 and 38 whose base and emitter junctions effectively operate as zener diodes. A pair of input coupling resistors 37 and 39 also appear between the input terminals 28, 32 and transistors 36, 38. The actual pressure signal thus limited is fed to a unity gain (K=1) isolation amplifier 38 whose output is fed to one terminal 40 of an analog switch device 42 via a coupling resistor 44. The set point signal is likewise applied to a unity gain amplifier 46, the output of which is coupled via resistor 48 to one terminal 50 of a second analog switch 52. The analog switches 42 and 52 typically comprise Texas Instrument TL604 analog switches.

A second input terminal 54 and 56 of switches 42 and 52 are commonly coupled to a source of bias potential (+5 VDC) and a pump disable signal. The bias potential is coupled to terminal 60 and applied via a fixed resistor 58. The disable signal is coupled across a pair of input terminals 62 and 64, one of which is grounded, and a fixed resistor 66 and a grounded capacitor 68. The disable signal is applied from a source, not shown, and is operative to deactivate the vacuum pump motor 24 and the exhaust pump during an "idle" mode. When the disable signal is applied, circuit junction 70 goes "low", i.e. to ground. This causes the output terminal 72 of the analog switch 42 to go "low", while output terminal 74 of analog switch 52 goes "high" due to the fact that like terminals 76 and 78 of the analog switches 42 and 52 are respectively coupled to ground and +5 VDC, respectively.

In absence of any disable signal, the analog switches 42 and 52 are operable to couple the two DC signals corresponding to actual pressure and set point pressure to a differential amplifier 80 comprised of a pair of operational amplifier 82 and 84, both of which include resistor-capacitor feedback networks, 86 and 88, interconnected by a fixed resistor 90. The output of the differential amplifier 80 comprises a difference signal which is fed via the fixed resistor 92 to the input of a DC integrator 94 comprised of an operational amplifier 96 including a fixed capacitor 98 coupled between its input and output terminals in a well known fashion. The output of the integrator 94 ranges between +15 volts and −15 volts DC.

The variable DC output voltage appearing at circuit junction 100 is next fed to a signal conditioning amplifier 102 for driving a pulsewidth modulator integrated circuit module 104 which typically comprises a Motorola type MC34060 integrated chip. Inasmuch as the integrated circuit 104 requires a +1.2 to +3.8 volt DC input to provide a 0% to 100% pulsewidth modulation (PWM) output, the signal conditioning amplifier 102 is operable to change the integrator output which ranges between +15 volts and −15 volts to the required input level. The signal conditioning amplifier 102 is comprised of an operational amplifier 106 having a feedback resistor 108 coupled between the output and the input thereof while a second input receives a biasing signal provided by a voltage divider 110 and 112 coupled across a source of positive DC potential (+V) coupled to terminal 114.

The pulsewidth modulated output of the PWM module 104 is applied to a differential line driver circuit 116 which is comprised of an operational amplifier 118 having its non-inverting and inverting outputs respectively coupled to a pair of output terminals 120 and 122 and which are coupled to a pair of input terminals of a differential line receiver shown in FIG. 3. The operational amplifier 118 is suitably biased by a +5 VDC volt bias potential applied to the input terminals via a pair of fixed resistors 124 and 126 commonly connected to terminal 128.

Referring now to FIG. 3, the pulsewidth modulated output signal from the differential line drive 116 shown in FIG. 2 is connected via a line coupler, not shown, to a pair of input terminals 124 and 126 and then to a differential line receiver 128 comprised of an operational amplifier 130. The output of the line receiver amplifier 130 is coupled to the light emitting diode 132 of a semiconductor opto-isolator device 134 which typically comprises a 6N139 opto-isolator manufactured by Hewlett-Packard. The light emitting diode 132 is further coupled to a +5 VDC supply potential applied to terminal 136 and connected to the diode 132 via the resistor 138. A photosensitive diode 140 receives light emitted from the light emitting diode 132 and is furthermore coupled between the base and collector junctions of a first n-p-n transistor 142 whose emitter is coupled to a base of a second n-p-n transistor 144. The output of the opto-isolator 134 is provided at circuit junction 146 between a pair of load resistors 148 and 150 to which is applied a positive +15 VDC supply potential connected to terminal 152.

The opto-isolator output appearing at circuit junction 146 is applied to a unity gain isolation amplifier comprising the operational amplifier 154. The output of the operational amplifier 154 is then fed to a pulsewidth modulation to DC filter 156 which simply is comprised of a resistor 158 and a capacitor 160 which is returned to ground. Accordingly, a varying DC voltage appears at circuit junction 162 between the resistor 158 and capacitor 160. This DC voltage comprises a control signal which is applied to another unity gain operational amplifier 164 which provides isolation between circuit junction 162 and a potentiometer 166. The potentiometer 166 provides an amplitude adjustment for a first pair of output terminals 168 and 170 which is adapted to provide a DC output of, for example, in the range between 0 and +10 VDC. A unity gain operational amplifier 172 is additionally provided between the wiper of the potentiometer 166 and terminal 168 for providing desired signal isolation. The wiper of the amplitude adjust potentiometer 166 is additionally coupled to a voltage divider comprised of a pair of like valued fixed resistors 174 and 176. The junction 178 provides a voltage output across terminals 180 and 182 which is one half of the output voltage appearing across the terminals 168 and 170, and accordingly is a voltage in the range between 0 and +5 VDC. A unity gain isolation operational amplifier 184 is additionally provided between circuit junction 178 and output terminal 180 in a like manner as the isolation amplifier 172.

Either of the outputs appearing across output terminals 168, 170 and 180, 182 comprises a control input to the DC motor speed controller 26 shown in FIG. 1. The speed controller 26 comprises, for example, a Model MM200U adjustable speed control manufactured by Minnerick Electric Company. The control signal provided by either pair of output terminals shown in FIG. 3 would be applied across a speed adjustment potentiometer, not shown, which controls the DC voltage which is applied across the armature of the vacuum pump motor 24.

Thus what has been shown and described is a closed loop vacuum pressure control system utilized in conjunction with apparatus for coating semiconductor wafers whereupon such apparatus is able to provide wafer coating uniformity and freedom from contamination on an order greater than heretofore obtainable. For example, coating uniformity of ±1% from edge to center and from wafer to wafer are achievable as contrasted with ±10% variation heretofore encountered with known state of the art equipment.

Having thus shown and described what is at present considered to be the preferred embodiment of the invention, it should be noted that the same has been made by way of illustration and not limitation. Accordingly, all alterations, modifications and changes coming within the spirit and scope of the invention, as set forth in the claims, are herein meant to be included.

We claim:

1. A pressure control system utilized, for example, in connection with chemical vapor deposition apparatus, comprising in combination:
   a reduced pressure chamber;
   an exhaust pump coupled to said pressure chamber;
   an electric motor coupled to said exhaust pump for powering said pump;
   controller means operable in response to the difference between the actual pressure within the pressure chamber and the desired pressure therein and generating a pulsewidth modulated pulse train whose pulsewidth varies in accordance with said difference;
   pulsewidth modulation to DC converter means responsive to said pulsewidth modulated pulse train and being operable to generate a control signal whose amplitude varies in accordance with said pulsewidth; and
   motor control means coupled to said electric motor and being responsive to said control signal and operable to vary the speed of said motor thereby powering said exhaust system to control the pressure within said pressure chamber.

2. The system as defined by claim 1 wherein said motor comprises a DC motor and said exhaust pump is coupled to said pressure chamber for removing gases therein for operating in the range of 0-10 torr.

3. The system as defined by claim 2 wherein said pulsewidth modulation to DC converter is operable to generate a DC control signal and wherein said motor control means is responsive to said DC control signal and being operable to control the armature voltage of said DC motor, thereby varying the speed of said motor.

4. The system as defined by claim 1 and additionally including transducer means coupled from said reduced pressure chamber to said controller means and being operable to generate a signal corresponding to the actual pressure within said pressure chamber, and means generating a signal coupled to said controller means corresponding to the desired pressure within said pressure chamber.

5. The system as defined by claim 4 wherein said transducer means comprises a manometer.

6. The system as defined by claim 4 wherein said controller means includes differential amplifier means responsive to the actual pressure signal and the desired pressure signal and being operable to generate a difference signal;
   integrator circuit means coupled to said difference signal and generating therefrom a signal of varying amplitude; and
   pulsewidth modulation generator means coupled to said signal of varying amplitude, said pulsewidth generator means being operable to generate a pulsewidth modulated pulse train whose pulsewidth varies in accordance with the magnitude of said signal of varying amplitude.

7. The system as defined by claim 6 wherein said controller means additionally includes isolation amplifier means coupled between said actual pressure signal, said desired pressure signal and said differential amplifier means.

8. The system as defined by claim 7 and additionally including signal limiter means coupled between said actual pressure signal, said desired pressure signal and isolation amplifier means.

9. The system as defined in claim 6 wherein said controller means additionally includes signal switch means coupled between said actual pressure signal, said desired pressure signal and said differential amplifier means and being operable in response to an applied control signal to interrupt the coupling of at least one of said pressure signals coupled to said differential amplifier means thereby disabling the operation of the pulsewidth modulation generator circuit means.

10. The system as defined by claim 9 wherein said actual pressure signal and said desired pressure signal are comprised of DC signals and wherein said integrator circuit means comprises a DC integrator generating a DC signal of varying amplitude.

11. The system as defined by claim 6 wherein said controller means additionally includes signal conditioning amplifier means coupled between said integrator circuit means and said pulsewidth modulation generator means for conditioning the input signal level to said generator means for operating between 0 and 100% pulsewidth modulation.

12. The system as defined by claim 6 wherein said controller means additionally includes signal line driver circuit means coupled between said pulsewidth modulation generator means and said pulsewidth modulation to DC converter means.

13. The system as defined by claim 12 wherein said signal line driver circuit means comprises a differential line driver.

14. The system as defined by claim 4 wherein said pulsewidth modulation to DC converter means includes filter circuit means for converting said pulsewidth modulation pulse train to a DC control signal.

15. The system as defined by claim 14 wherein said pulsewidth modulation to DC converter means additionally includes signal isolation means coupled between said control means and said filter circuit means.

16. The system as defined by claim 15 wherein said signal isolation means comprises a semiconductor opto-isolator device.

17. The system as defined by claim 14 wherein said pulsewidth modulation to DC converter means additionally includes means for adjusting the level of said DC control signal.

18. The system as defined by claim 17 wherein said means for adjusting the level of said DC control signal comprises a potentiometer coupled to said filter circuit means.

19. The system as defined by claim 14 wherein said filter circuit means comprises a resistance-capacitance filter circuit.

20. The system as defined by claim 14 wherein said pulsewidth modulation to DC converter means additionally includes signal line receiver means coupled to said controller means.

* * * * *